United States Patent [19]

Rhodes et al.

[11] Patent Number: 5,078,975
[45] Date of Patent: Jan. 7, 1992

[54] DROP DEPLOYMENT SYSTEM FOR CRYSTAL GROWTH APPARATUS

[75] Inventors: Percy H. Rhodes; Robert S. Snyder; Marc L. Pusey, all of Huntsville, Ala.

[73] Assignee: The United States of America as represented by the Administor of the National Aeronautics and Space Administration, Washington, D.C.

[21] Appl. No.: 629,740

[22] Filed: Dec. 18, 1990

[51] Int. Cl.[5] .............................................. C30B 7/02
[52] U.S. Cl. ................... 422/253; 156/600; 156/DIG. 62; 156/DIG. 93
[58] Field of Search ....... 156/600, DIG. 62, DIG. 93; 422/102, 245, 253

[56] References Cited

U.S. PATENT DOCUMENTS

| | | | |
|---|---|---|---|
| 3,013,311 | 12/1961 | Meissner | 156/DIG. 62 |
| 4,517,048 | 5/1985 | Shlichta | 422/245 |
| 4,886,646 | 12/1989 | Carter et al. | 156/600 |
| 4,909,933 | 3/1990 | Carter et al. | 210/205 |
| 4,917,707 | 4/1990 | Charmonte et al. | 156/600 |
| 4,919,899 | 4/1990 | Hermann et al. | 156/600 |

OTHER PUBLICATIONS

"Microdialysis Crystallization Chamber"; Sieker; *Journal of Crystal Growth* 90 (1988); pp. 349-357.

*Primary Examiner*—Olik Chaudhuri
*Assistant Examiner*—Felisa Garrett
*Attorney, Agent, or Firm*—Robert L. Broad, Jr.; Jerry L. Seemann

[57] ABSTRACT

This invention relates to a crystal growth apparatus (10) generally used for growing protein crystals wherein a vapor diffusion method is used for growing the crystals. In this apparatus, a precipitating solution and a solution containing dissolved crystalline material are stored in separate vials (12, 14), each having a resilient diaphragm (28) across one end and an opening (24) with a puncturable septum (26) thereacross at an opposite end. The vials are placed in receptacles (30) having a manifold (41) with a manifold diaphragm (42) in contact with the vial diaphragm at one end of the receptacle and a hollow needle (36) for puncturing the septum at the other end of the manifold. The needles of each vial communicate with a ball mixer (40) that mixes the precipitate and protein solutions and directs the mixed solution to a drop support (64) disposed in a crystal growth chamber (16), the drop support being a tube with an inner bevelled surface (66) that provides more support for the drop (68) than the tubes of the prior art. A sealable storage region (70) intermediate the drop support and mixer provides storage of the drop (68) and the grown crystals.

26 Claims, 3 Drawing Sheets

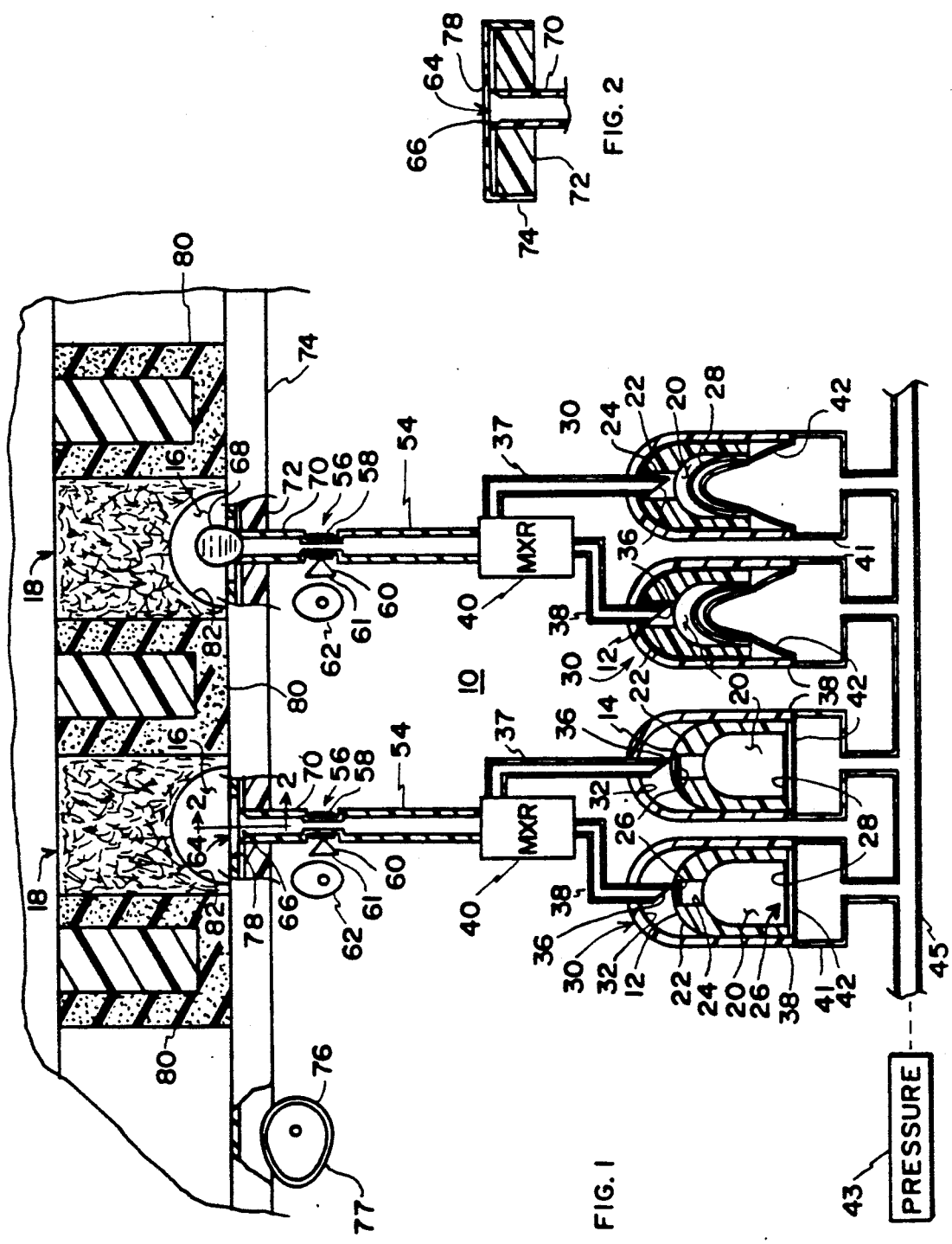

DROP DEPLOYMENT SYSTEM FOR CRYSTAL GROWTH APPARATUS

ORIGIN OF THE INVENTION

The invention described herein was made by an employee of the U.S. Government and may be manufactured and used by or for the Government for governmental purposes without the payment of any royalties thereon or therefor.

FIELD OF THE INVENTION

This invention relates generally to protein crystal growth devices, and more particularly to such an apparatus for use in a microgravity environment wherein protein and precipitate solutions are stored in separate containers and mixed by a ball mixer upon deployment.

BACKGROUND OF THE INVENTION

In the past, microgravity protein crystal growth experiments utilizing a well known vapor diffusion method for concentrating a drop of protein solution within which protein crystals are grown have typically taken place in an apparatus housing a number of crystal growth experiments which are activated simultaneously. In one particular embodiment of such apparatus, crystal growth chambers are each provided with a wicking element dampened with a precipitate solution of a concentration calculated to draw solvent from the drop at a selected rate over a predetermined period of time, slowly concentrating the protein solution and allowing highly ordered protein crystals to form. The protein droplet is situated at the end of a single pipette or side-by-side pipettes located near the wicking element, with the pipettes each coupled to a small syringe containing, in the single pipette version, a pre-mixed solution of precipitate and protein solution. When deployed, the pre-mixed solution forms a drop at the end of the pipette. Each pipette of the side-by-side version is coupled to a separate syringe, one containing the protein solution and the other containing a precipitate solution, with mixing of the solutions occurring upon deployment. This mixing may be achieved by repeatedly cycling the two fluids into and out of the pipettes and syringes, or by simply allowing the fluids to mix by diffusion after the drop is deployed. The syringes are filled prior to flight, and the pipettes capped to prevent fluid loss by plugs connected to a common operating mechanism. When the operating mechanism is operated, all pipettes are uncapped simultaneously. Likewise, plungers of the syringes are also coupled to a common operating mechanism so that when operated, the drops are deployed simultaneously.

While this type device has been proven to work relatively well during several Space Shuttle flights, problems have occurred. Most notable among these problems is the difficulty of achieving complete mixing, especially when dissimilar fluids are mixed. Another problem is that the mechanism that deploys the drops is not designed for repeated cycling, and possibly may fail. Additionally, in some instances, the drops were lost due to the relative instabilities between the drops and pipettes during maneuvers in space. Further, cycling of the fluids as described introduces air bubbles therein, and the mechanical action introduces small but unacceptable temperature rises in the crystal growth enclosure, which is temperature-regulated to ±0.1 degree C. Still further, as the syringes are constructed of polysulfone, a translucent material, the solutions are difficult to load and evaluate, and the capping procedure cannot be evaluated for its sealing and compatibility before flight. Further yet, large crystals may not be collectible, and marginally collectible crystals may become damaged as they are drawn back into the small openings of the pipettes, or otherwise become "hung" on a surface between the two pipettes.

Accordingly, it is an object of this invention to provide an improved crystal growth apparatus that more efficiently mixes precipitate and protein solutions, is better configured to support a drop of solution, and can capture and protect crystals of the largest size grown.

SUMMARY OF THE INVENTION

A crystal growth apparatus is constructed wherein a vapor diffusion method is used to control crystal growth in a plurality of closed growth chambers each having a wicking element dampened with a precipitate solution, and a drop support proximate each wicking element for supporting a drop of fluid in which crystals are grown. Additionally, for each growth chamber, a pair of fluid containers are coupled to a mixer in turn coupled to the drop support, for mixing fluids in the containers, after which the mixed fluids are moved to form a drop on the drop supporter. After a predetermined period of time during which crystals are grown, remaining portions of the drops and crystals therein are drawn into separate storage regions, one for each drop, and sealed for later study.

BRIEF DESCRIPTION OF THE DRAWINGS

FIG. 1 is a view, partially in section, of an embodiment of the present invention.

FIG. 2 is a sectional view taken along lines 2—2 of FIG. 1.

DESCRIPTION OF THE PREFERRED EMBODIMENT

Figure 5:
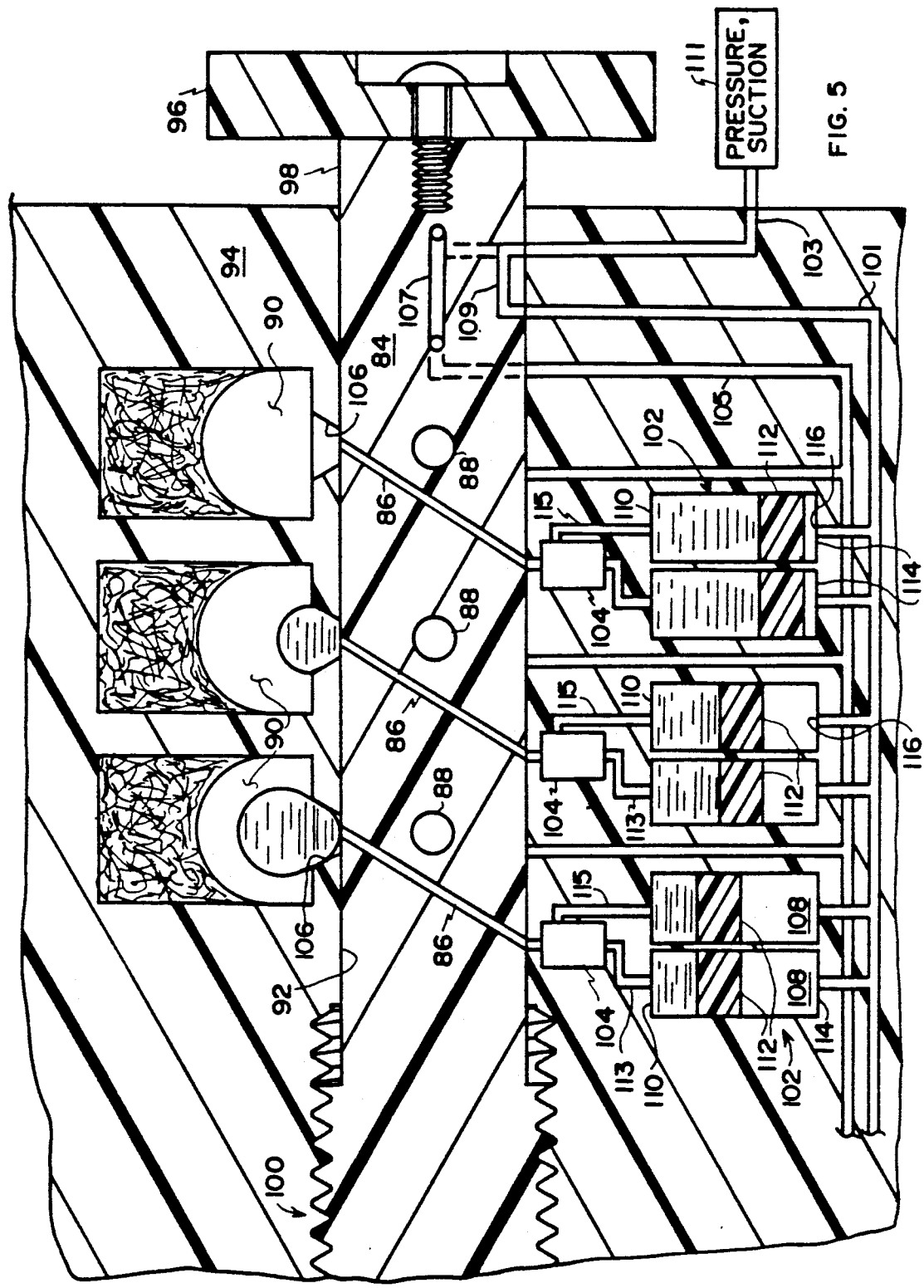
FIG. 5 is a view, partially in section, of an alternate embodiment of the present invention.

Referring to FIG. 1, a system 10 is shown for storing a precipitate solution and a protein solution in separate vials 12 and 14, and for deploying these solutions in a crystal growth cavity 16 having a wicking element 18 moistened with a precipitate solution.

Vials 12 and 14, one for precipitate solution and one for protein solution, are each constructed as shown in FIG. 1 having a hollow interior 20 for storage of one of the solutions, and a generally rounded end 22 provided with an opening 24 centrally located therein. A thin septum 26 is mounted in opening 24, and sealably contains the solutions in vials 12 and 14 prior to deployment. Sealing an opposite end 26 of each of vials 12 and 14, and in contact with the solution therein, is a thin, flexible diaphragm 28. The vials are slidably disposed in receptacles 30 each configured at an interior end 32 to match the rounded ends 22 of vials 12 and 14, with each interior end 32 provided with a hollow needle 36 aligned with opening 24 of vials and 14. At an opposite end 38 of receptacles 30 is a hollow enclosure or manifold 41 provided with a flexible diaphragm 42 generally in contact with the respective vial 12 and 14 and its diaphragm 28. A source of hydraulic or pneumatic pressure 43 is in turn connected to each of manifolds 41 via conduit 45 such that when pressure is provided to manifolds 41, manifold diaphragm 42 applies pressure to the respective vial and its diaphragm 28, moving vials 12 and 14 in receptacles 30 and transferring pressure to interiors 20 of vials 12 and 14 to force the solutions upwardly into mixers 40. Needles 36 are each connected via tubes 37 and 38 to a conventional ball mixer 40, such as the ball mixer disclosed in *Biophysical Journal*, Vol. 24, published on 1988, pages 2–20.

Figure 3:
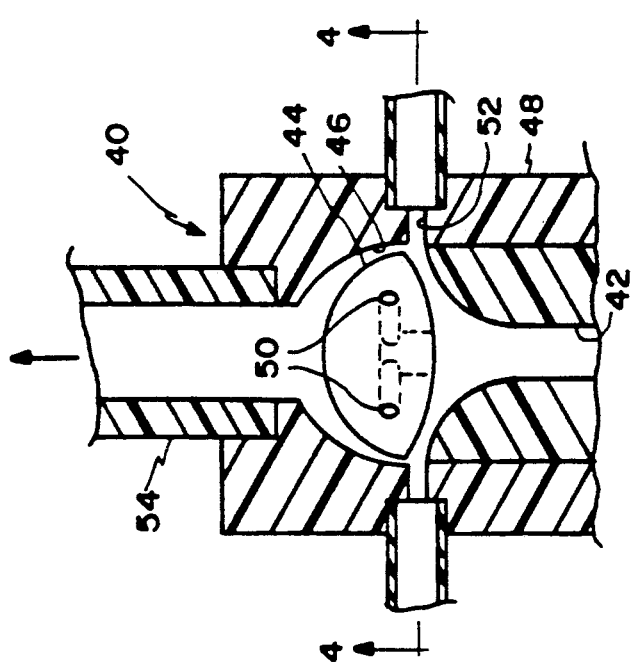
FIG. 3 is a cut-away view of a ball mixer of the present invention.
Figure 4:
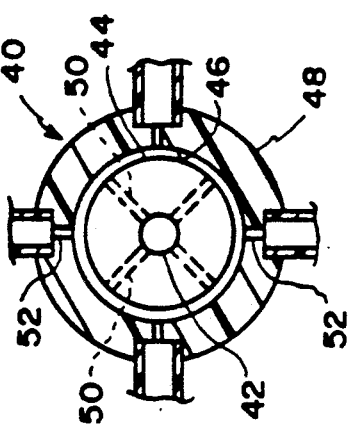
FIG. 4 is a sectional view taken along lines 4—4 of FIG. 3.

In this type mixer, as shown in FIGS. 3 and 4, the first of the fluids to be mixed is directed through an axial, hollow inlet opening 42 to an asymetrically-shaped ball 44 spaced from sides 46 of a mixer housing 48, and supported by means not shown. Ball 44 is configured having a plurality of opposed jets 50 positioned as shown and through which a portion of the first fluid is directed. The remaining portion of the first fluid flows between ball 44 and sides 40 adjacent ball 44. The second fluid is introduced into mixer 40 by a plurality of ports 52 positioned approximately 45 degrees with respect to jets 50, and slightly upstream ball 44. As the two fluids flow through mixer 40, the reduced-in-diameter flow path therethrough provides a venturi effect, increasing velocity of the fluid flow and creating turbulence that thoroughly mixes the fluids they as they flow around ball 44, the fluids exiting mixer 40 through exit tube 54.

Tube 54, constructed as shown in FIG. 1, is provided with a narrowed portion 56 constructed of a flexible silicone polymer material with a sheath 58 of thin stainless steel or like crimpable material encircling portion 56. A cam driven wedge 60 is movably positioned adjacent portion 56, with wedge 60 positioned to crimp sheath 58 when driven on a flat side 61 by cam 62, effecting a closure of tube 54 at narrowed portion 56. From narrowed portion 56, tube 54 continues to a drop support end 64 terminating in crystal growth chamber 16, drop support end 64 having a beveled inner region 66 which is better adapted to support a drop of fluid 68 than a flat-tipped pipette generally used in the prior art. The internal dimensions of this drop support end portion 64 is constructed to form a storage region 70 for grown crystals, such storage region extending between narrowed portion 56 and drop support end 64 and having a diameter and length to accommodate the largest crystals grown in drop 68. Additionally, beveled inner region 66 provides a funneling effect to channel crystals into storage region 70, reducing the probability that crystals may become "hung" at the end of drop support 64.

Drop support ends 64 may be set flush in a rigid support 72 (FIGS. 1 and 2), or as shown, ends 64 may protrude slightly above support 72. A slidable and liftable valve member 74 positioned over support 72 is operated by a cam member 76, with valve member 74 having openings 78 disposed to be selectively positioned in registry with support ends 64. Cam member 76 is provided with a frictional surface 77 which bears on an underside of valve member 74, allowing it to simultaneously lift and slide valve member 74 to cover drop support ends 64 or bring openings 78 into registry with drop support ends 64. Valve member 74 is biased against support 72 by a plurality of resilient sponge rubber springs 80, which are configured as shown in FIG. 1, with the wicks 18 also being resilient, the wicks positioned in a rectangular region between springs 80. Wicks 18 are each provided with a depression or cavity 82 adjacent drop support ends 64, depressions 82 forming the crystal growth chamber 16.

In operation, and referring to the embodiment of FIG. 1, the vials are separately loaded with precipitate and protein solutions and placed in their respective receptacles 30. After being situated in a microgravity environment, drops 68 are deployed by applying pressure to manifolds 41, distending diaphragms 42 and forcing vials 12 and 14 to "bottom out" in the contoured ends 32 of receptacles 30. When this occurs, needles 36 puncture septums 26, releasing the contents of each of vials 12 and 14 to be mixed by mixers 40. Continued application of pressure causes manifold diaphragm 42 to bear upon and distend vial diaphragm 28, forcing fluids in the vials to be forced through mixers 40 and exit tubes 54 to drop support 64 where the drops are formed. At the end of a selected period of time wherein crystals are grown, the drops are recovered by removing all or some of the pressure in manifolds 41 and allowing diaphragms 42 to relax. This draws the drops and crystals into storage regions 70 of tubes 54, after which wedges 60 are operated on flat side 61 by cams 62 to crimp sheaths 58 and permanently close tubes 54 at narrowed portion 56. The slide valve 74 is then operated to close storage regions 70 at drop supports 64. To recover the crystals, the wicks and sponge springs are removed, exposing the slide valve, which is also removed, after which the storage regions 70 are removed with a special extraction tool (not shown) that cuts narrowed portion 56 at the mixer side of crimped sheath 58. At this point, the fluid and crystals may be removed or the storage portions 70 of tubes 54 may be capped and stored for later study.

An alternate embodiment of this invention is shown in FIG. 5. Here, a TEFLON TM (or other inert material) shaft 84 is closely fitted in and rotatably mounted in a cylindrical channel 92 cut, machined, or molded in a rigid block of material 94, this material selected to be compatible and non-reactive with fluids used therein. Shaft 84 is provided with transverse fluid deployment passageways 86 and separate transverse storage and recovery passageways 88 each having a free piston 118 (FIG. 6), passageways 88 positioned normal to and offset from passageways 86. A plurality of crystal growth chambers 90, each having a drop support opening 106 as described above, are positioned in block 94 on one side of shaft 84, with a like plurality of fluid dispensing apparatus 102 positioned in block 94 on an opposite side of shaft 84. Fluid dispensing apparatus are each constructed as shown in FIG. 5, with a free piston 112 disposed to move the fluid in containment regions 108 through mixers 104 responsive to pressure from bore 101. Storage and recovery passageways 88 are of a larger bore than deployment passageways 86, also as described above, to capture and store crystals of the largest size grown. A thumbwheel 96 connected to one end 98 of shaft 84 allows shaft 84 to be rotated, either manually or by electronic means (not shown), and the opposite end of shaft 84 is threaded and rotatably supported in a threaded portion 100 of channel 92 to rotate and move shaft 84 longitudinally, selectively aligning growth chambers 90 with fluid deployment passageways 86 or recovery and storage passageways 88. Additionally, pressure passageway 101 for communicating pressure to dispensing apparatus 102, when deployment passageways 86 are aligned with dispensing apparatus 102 and drop supports 106, is coupled to a source of pressure or suction 111 via bore 109 (solid lines) in shaft 84, while suction passageway 105 for communicating suction to recovery and storage passageways 88 is couplable to source 111 via a bore 107, shown in its actual position (solid lines) and its operative position (dashed lines). Source 111 of pressure or suction, for example, may be a manually operated syringe, for pneumatically generating the pressure or suction, or an automated, regulated source of pressure or suction. The ball mixers 104 are mounted proximate dispensers 102, but may be mounted in shaft 84 (not shown).

In this embodiment, the solutions to be mixed are contained in cylindrical or tubular containment regions 108. Regions 108 are coupled at one end 110 via conduits 113 and 115 with ball mixers 104, and as stated, are provided with free pistons 112 at the opposite end 114. A single opening 116 in end 114 of regions 108 is connectible to source of pressure 111, which provides energy to move pistons 112 in order to deploy the fluids through mixer 104 to form the drop at drop support openings 106.

Figure 6:
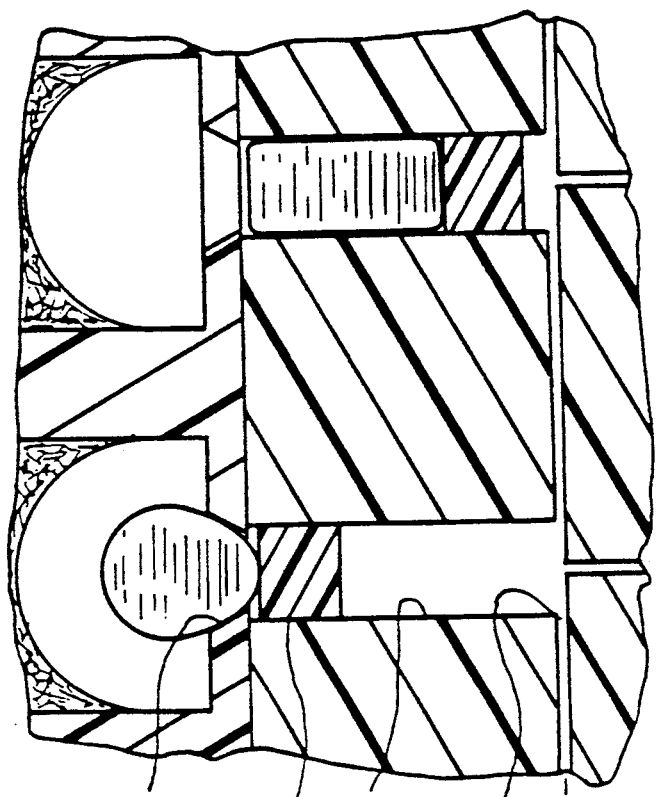
FIG. 6 is a view illustrating particular details of the alternate embodiment shown in FIG. 5.

For recovering the remainder of the drop and crystals therein, the recovery and storage passageways 88 in shaft 84 are also provided with free pistons 118 (FIG. 6). Here, as one end 120 of the storage passageways 88 are aligned with the source of suction 111, the opposite ends of passageways 88 are also aligned with drop support openings 106. This allows the remaining portion of the drop and crystals therein to be drawn into storage passageways 88 responsive to suction applied to piston 118.

For the embodiment shown in FIG. 4, operation is as follows. The fluids are loaded into channels 108 with pistons 112 behind the fluid, and shaft 84 rotated to a position to seal dispensing apparatus 102, this position being other than a position of alignment of either deployment passageways 86 or recovery and storage passageways 88 with deployment apparatus 102 and drop support openings 106. Upon deployment, shaft 84 is rotated, bringing deployment passageways 86 into registry with deployment apparatus 102 at one end and drop support openings 106 at the other end. This action also aligns source 111 of pressure via passageways 101, 109, and 103 with dispensing apparatus 102, which pressure being sufficient to move pistons 112 in channels 108 to discharge the fluids through mixers 104 to form the drops at drop support openings 106 in crystal growth chambers 90. For recovering the remainder of the drops and the grown crystals after the requisite time period has elapsed, shaft 84 is again rotated, bringing storage regions 88 in shaft 84 into registry with growth chambers 90 at one end and with suction passageways 103, 107, and 105 at the opposite end. This suction is sufficient to draw piston 118 back in passageways 88, which in turn draws the remainder of the drops into storage regions 88. The shaft is then rotated to the intermediate position, sealing storage regions 88. To remove the crystals, the shaft is removed and the crystals flushed from the respective storage regions and stored in separate vials, or capped and stored for later study.

Having thus described our invention and the manner of its use, it is apparent that incidental modifications may be made thereto that fairly fall within the scope of the following appended claims, wherein we claim:

1. A crystal growth apparatus including a housing having a plurality of crystal growth chambers therein, said apparatus comprising:
   at least a pair of fluid containers, the first container of said pair of containers containing a solution of dissolved material for growing crystals and the second container of said pair of containers containing a precipitate solution for facilitating crystal growth;
   mixing means in communication with said containers for receiving and mixing said solutions and for directing said mixed solutions into said growth chamber;
   a wicking element in each said growth chamber and disposed for containing a predetermined quantity of precipitating agent; and
   closure means for sealing said growth chamber responsive to admission of said mixed solutions therein.

2. An apparatus as set forth in claim 1 including a storage chamber in communication with said growth chamber, for sealably storing grown crystals therein.

3. An apparatus as set forth in claim 2 including drop support means positioned near said wicking means, for supporting a drop of fluid in said growth chamber.

4. An apparatus as set forth in claim 3 including means for forcing and directing said solutions into said mixing means.

5. An apparatus as set forth in claim 4 including closure means for sealing said growth chamber responsive to admission therein of said mixed solutions.

6. An apparatus as set forth in claim 5 including a storage chamber disposed in communication with said growth chamber.

7. An apparatus as set forth in claim 6 wherein said closure means is disposed for sealing said storage means.

8. An apparatus a set forth in claim 7 wherein said drop support means is positioned intermediate said growth chamber and said storage chamber.

9. A crystal growth apparatus having a plurality of closable crystal growth chambers in which a vapor diffusion method for growing crystals in a drop of fluid is used, said apparatus comprising:
   a wicking element in each said growth chamber disposed for containing a predetermined quantity of precipitating agent;
   drop support means proximate said wicking element in each said growth chamber, for supporting a drop of fluid containing a dissolved material from which crystals are grown;
   at least two fluid containers for each said drop support means, one containing a solution of said dissolved material and the other containing a precipitate solution for facilitating crystal growth, said containers each further comprising opposed ends having an opening at one of said ends;
   means for selectively applying pressure and suction to interiors of said containers at an opposite end, for moving said solutions through said openings;
   a discrete mixer for each said drop support means and respective said fluid storage containers, said mixer having inlets coupled to said openings of said fluid storage containers and an outlet through which said solutions are passed responsive to said pressure applied to said interiors, for mixing said precipitate solution and said solution of dissolved material as said solutions pass therethrough; and a fluid and crystal storage region coupled to each said drop support means and being sealable downstream said mixer and at said drop support means, for sealably storing a recovered portion of said drop and grown crystals therein.

10. A crystal growth apparatus as set forth in claim 9 wherein said drop support means comprises an opening having a beveled inner edge.

11. A crystal growth apparatus as set forth in claim 9 wherein each said fluid storage containers comprises a movable vial having a puncturable septum sealably disposed across said opening, said vial positioned in an elongated receptacle, said receptacle provided at one end with a hollow needle coupled to said mixer and aligned with said opening, and said opposite end of said vial provided with a first resilient diaphragm for transmitting pressure to said solutions, and suction to said solutions as said pressure is removed and said first diaphragm relaxes.

12. A crystal growth apparatus as set forth in claim 11 wherein said means for applying pressure and suction to said diaphragm of said vial comprises a manifold having a second resilient diaphragm in contact with said first diaphragm of said vial, and a source of pressure selectively coupled to said manifold.

13. A crystal growth apparatus as set forth in claim 9 wherein said mixer comprises a ball mixer.

14. A crystal growth apparatus as set forth in claim 9 wherein said storage region comprises:
 a tube for containing the drop of fluid and largest crystals grown therein and coupled to said drop support means;
 a narrowed, flexible region in said tube, said narrowed region having a crimpable sheath disposed therearound;
 crimping means disposed for crimping said sheath, closing said narrowed region and one end of said tube; and
 valve means at said beveled opening, for closing an opposite end of said tube, sealing said drop and said crystals therein.

15. A crystal growth apparatus as set forth in claim 10 comprising a shaft having said storage region therein and a transverse passageway for each said growth chamber, said shaft rotatably disposed and closely fitted in a cylindrical opening, with said crystal growth chambers each having said drop support means disposed adjacent said shaft, and said mixer exit opening for each said growth chamber communicating with said opening, whereby as said shaft is rotated, each said mixer exit opening and each said drop support means are brought into communicating relation with opposite ends of said passageway, allowing fluid from said mixer to form said drop, and after a selected period of time has elapsed, further rotation of said shaft aligns said storage region with said drop support means, allowing said drop and crystals therein to be stored in said storage region.

16. A crystal growth apparatus as set forth in claim 15 wherein each said fluid storage containers comprises a cylindrical fluid storage region having an opening at one end and a free piston closely fitting said cylindrical fluid storage region at an opposite end, said piston movable therein responsive to pressure and suction applied to said piston.

17. A crystal growth apparatus as set forth in claim 16 comprising passageways in said shaft for selectively coupling pressure and suction to said fluid containers.

18. A crystal growth apparatus for growing crystals in a plurality of separate drops of fluid, each drop enclosed in a separate, closable crystal growth chamber comprising:
 a wicking element in each said growth chamber dampened with a liquid precipitating agent;
 a drop support including an opening proximate said wicking element, said opening provided with beveled interior edges;
 a pair of containers for each said drop support, one containing a protein solution and the other containing a precipitate solution, said containers each having an opening at one end;
 means for selectively applying pressure and suction to interiors of said containers at an opposite end of said containers, for moving said solutions through said openings;
 a ball mixer disposed for mixing dissimilar fluids and having fluid entrance openings and a fluid exit opening, said fluid entrance openings coupled to said openings of said pair of containers and said fluid exit opening coupled to said drop support; and
 a fluid and crystal storage region coupled to each said drop support and being sealable downstream said mixer and at said drop support, for sealably storing a recovered portion of said drop and grown crystals therein.

19. A crystal growth apparatus as set forth in claim 18 wherein said means for selectively applying pressure and suction to said interiors comprises pneumatic pressure.

20. A crystal growth apparatus as set forth in claim 18 wherein each said fluid storage containers comprises a movable vial having a puncturable septum sealably disposed across said opening, said vial positioned in an elongated receptacle, said receptacle provided at one end with a hollow needle coupled to said mixer and aligned with said opening in said vial, and said opposite end of said vial provided with a first diaphragm for transmitting said pressure to said interiors, and suction to said interiors as said pressure is removed and said first diaphragm relaxes.

21. A crystal growth apparatus as set forth in claim 20 wherein said means for selectively applying pressure and suction to said interiors of said vials each comprises a manifold having a second diaphragm in contact with said first diaphragm, and a source of pressure coupled to said manifold.

22. A crystal growth apparatus as set forth in claim 21 wherein said storage region comprises:
 a tube for containing the drop of fluid and largest crystals grown therein, said tube coupled to said drop support and said mixer;
 a narrowed, flexible region in said tube adjacent mixer, said narrowed region having a crimpable sheath disposed therearound;
 crimping means disposed for crimping said sheath, closing said narrowed region at one end of said tube; and
 valve means at said drop support, for closing an opposite end of said tube, sealing said drop and said crystals therein.

23. A crystal growth apparatus as set forth in claim 18 wherein said pair of containers each comprises:
 a first cylindrical container having a first opening at one end coupled to one of said fluid entrance openings of said ball mixer, and an opposite end having a second opening selectively coupled to a source of pressure; and a first free piston closely fitting said first cylindrical container and disposed for moving said solution through said first opening responsive to said pressure.

24. A crystal growth apparatus as set forth in claim 23 comprising:

a shaft having said storage region therein and a transverse passageway for each said growth chamber, said shaft rotatably disposed and closely fitted in a cylindrical opening, with said growth chambers each having said drop support positioned adjacent said shaft, and said ball mixer fluid exit opening communicating with said cylindrical opening, whereby as said shaft is rotated, each said mixer exit opening and each said drop support is brought into communicating relation with opposite ends of said transverse passageways, allowing fluid from said mixer to form said drop at said drop support, and after a selected period of time, said shaft is rotated aligning each said storage region with each said drop support, allowing a remaining portion of said drop and said crystals therein to be recovered and stored in said storage region.

25. A crystal growth apparatus as set forth in claim 24 comprising passageways in said shaft for coupling pressure to said pair of containers.

26. A crystal growth apparatus as set forth in claim 25 wherein said fluid storage region comprises a second cylindrical container transversely located in said shaft, said second cylindrical container having an opening at one end disposed for communicating relation with said drop support, and an opening at an opposite end disposed for communicating relation with said source of suction, and a second free piston closely fitting in said second container, whereby as said shaft is rotated to align said fluid storage region with said drop support and said source of suction, said suction draws said piston and said remaining portion of said drop into said fluid storage region, with further rotation of said shaft misaligning said fluid storage region from said drop support and said source of suction, storing said remaining portion of said drop and crystals therein in said fluid storage region.

* * * * *